US006667231B1

United States Patent
Wu

(10) Patent No.: US 6,667,231 B1
(45) Date of Patent: Dec. 23, 2003

(54) METHOD OF FORMING BARRIER FILMS FOR COPPER METALLIZATION OVER LOW DIELECTRIC CONSTANT INSULATORS IN AN INTEGRATED CIRCUIT

(75) Inventor: Lixin Wu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/195,006

(22) Filed: Jul. 12, 2002

(51) Int. Cl.[7] .......................................... H01L 21/4763

(52) U.S. Cl. ...................... 438/628; 438/622; 438/677; 438/679

(58) Field of Search ................................ 438/622, 623, 438/624, 625, 626, 627, 628, 629, 688, 687, 677, 679

(56) References Cited

U.S. PATENT DOCUMENTS 6,294,458 B1 * 9/2001 Zhang et al. ................ 438/627
6,417,098 B1 * 7/2002 Wong et al. ................. 438/638

OTHER PUBLICATIONS

Edelstein et al., "A High Performance Liner for Copper Damascene Interconnects", *Proceedings of the IEEE 2001 International Interconnect Conference* (IEEE, 2001), pp. 9–11.

* cited by examiner

Primary Examiner—Carl Whitehead, Jr.
Assistant Examiner—Thanhha Pham
(74) Attorney, Agent, or Firm—Jacqueline J. Garner; W. James Brady, III; Frederick J. Telecky, Jr.

(57) ABSTRACT

An integrated circuit structure and method of making the same is disclosed, in which the adhesion of copper conductors (12, 22) to a low-dielectric constant insulating layer (10, 16) is improved. During the fabrication of the structure, exposed surfaces of the low-k insulating layers (10, 16), including the surfaces of these layers within contact, via, or trench openings, are exposed to nitrogen gas, preferably in a sputtering chamber. An optional plasma treatment of the insulating layers (10, 16) in the presence of nitrogen gas may also be performed. As a result, the surface portions of the insulating layers (10, 16) is made to be nitrogen-rich. A liner layer (8, 21) is then formed by reactive sputtering of tantalum nitride over the nitrogen-rich surfaces of the insulating layers (10, 16), followed by the sputtering of tantalum. Copper electrodes (12, 22) are then deposited into the openings in the corresponding insulating layers (10, 16) with improved adhesion resulting.

7 Claims, 6 Drawing Sheets

METHOD OF FORMING BARRIER FILMS FOR COPPER METALLIZATION OVER LOW DIELECTRIC CONSTANT INSULATORS IN AN INTEGRATED CIRCUIT

CROSS-REFERENCE TO RELATED APPLICATIONS

Not Applicable.

STATEMENT REGARDING FEDERALLY SPONSORED RESEARCH OR DEVELOPMENT

Not applicable.

BACKGROUND OF THE INVENTION

The invention is in the field of integrated circuit manufacture, and is more specifically directed to the formation of conductor layers in such circuits.

As is well-known in the art, the trend toward ever-shrinking feature sizes in modern integrated circuits is continuing, providing dramatic increases in functionality and decreased manufacturing cost over time. This decrease in feature size results in a corresponding decrease in the cross-sectional area of integrated circuit conductor elements, and thus a decrease in conductance of these elements, considering that conductance is directly proportional to the cross-sectional area of the conductor. It is therefore necessary to compensate for this decrease in conductance in order for device performance to remain the same or better, as manufacturing technologies improve.

To provide this increased conductivity, copper has become a popular metal for integrated circuit conductors, replacing aluminum metallization. Besides copper being significantly more conductive than aluminum, copper is also much less vulnerable to the electromigration failure than is aluminum. Because electromigration is also dependent upon current density, which of course increases for constant current as the cross-sectional area of the conductor decreases, copper not only provide improved conductivity over a similarly sized aluminum conductor, but can also support a higher current density, from an electromigration standpoint, than can an aluminum conductor.

Unfortunately, the manufacturing processes required to fabricate copper conductors are more complex and less robust than are the manufacturing processes for aluminum metallization. In modern integrated circuits, a damascene process is often used to form copper conductors. In this approach, trenches or vias are first formed in an insulator layer, following which a layer of copper is deposited, typically by electrochemical deposition (e.g., electroplating). Chemical-mechanical polishing (CMP) is then performed to remove the excess copper from the surface of the insulator, leaving the copper conductor inlaid within the via. While this processing is necessarily more cumbersome than conventional sputtering or evaporation of aluminum metal, additional problems are also presented by the implementation of copper conductors. One problem is the poisoning of minority carrier lifetimes that occurs if copper atoms diffuse into the underlying silicon from the copper metallization.

Another particularly troublesome problem is the relatively poor and inconsistent adhesion between copper metallization and the underlying layers. If adhesion is especially poor, the copper conductor can rip out of the via during the CMP step in the damascene process, rendering the integrated circuit nonfunctional. Poor adhesion can also cause voids in the copper conductors, presenting long term reliability issues.

A known approach to improve adhesion and also limit copper diffusion is to include a liner layer under the deposited copper. This liner layer, which may be a combination of layers of different materials, preferably includes a diffusion barrier to copper, and also preferably adheres strongly to both the underlying insulator layer and the overlying copper metallization. Edelstein et al., "A High Performance Liner for Copper Damascene Interconnects", *Proceedings of the IEEE* 2001 *International Interconnect Technology Conference* (IEEE, 2001), pp. 9–11, describes a liner layer that includes a layer of tantalum nitride (TaN) underlying a layer of tantalum metal (Ta). According to this approach, the overlying Ta layer is formed by turning off the nitrogen sputtering gas after the desired thickness of TaN has been sputtered from a tantalum target, over an underlying silicon dioxide dielectric. This article claims good adhesion of the liner and copper system to the underlying oxide.

Reduced feature sizes in integrated circuits also reduce the electrical isolation among the various metal conductors. In modern integrated circuits, electrical isolation between adjacent conductors in the same metallization "level", and also among conductors in adjacent metallization levels, must be adequate. Electrical isolation is even more problematic because of the planarization of each conductor level, to maximize step coverage of the conductors, and also to ensure accurate patterning, given the extremely shallow depths of focus available for deep UV photolithography of these small features.

Improvements in the dielectric isolation properties have been attained by using dielectric materials having a lower dielectric constant than conventional silicon dioxide. These materials include fluorine-doped silicon dioxide (also referred to as fluorinated silicate glass, or FSG), organosilicate glass (OSG), and other materials, such as SiLK dielectric material available from Dow Chemical Co., the Zirkon LK series of spin-on dielectric materials available from Shipley Company L.L.C., aerogel, xerogel, and other conventional low-k insulator materials. It is desirable to use these low-k dielectric materials in combination with high current conductors, such as copper interconnects, as described above.

It has been observed, in connection with this invention, that conventional liner layers do not provide adequate adhesion, especially when applied to low-k dielectrics. Specifically, it has been observed that the TaN/Ta bilayer liner, such as described in the Edelstein paper, has weak adhesion at the interface between TaN and the underlying dielectric. The adhesion in this system has also been observed to vary widely from wafer to wafer, indicating a run order effect within a lot. It is believed, according to this invention, that this poor adhesion of the TaN/Ta bilayer is due to the depletion of nitrogen in the sputtering chamber that results from the turning off of nitrogen sputtering gas for the previous wafer.

Other methods of improving the adhesion of a TaN/Ta bilayer liner to a low-k dielectric have been considered. One such approach is the deposition of a silicon dioxide cap over the low-k dielectric, to which the TaN/Ta bilayer liner adheres relatively well. While this approach may improve adhesion at the top surface of the dielectric, no oxide cap on can be formed the sidewalls of vias or trenches etched through the dielectric layer, so that the adhesion of the copper system will still be weak at those locations. The oxide cap cannot be formed after via or trench etch, of course, without severely limiting the size of the via or trench. Cleanup approaches, such as a hydrogen/helium reactive sputtering etch clean, may or may not improve adhesion, but will definitely require new hardware and an additional chamber.

BRIEF SUMMARY OF THE INVENTION

It is therefore an object of this invention to provide an integrated circuit structure, and a method of making the same, having improved adhesion of copper metallization to low-dielectric-constant dielectric layers.

It is a further object of this invention to provide such a structure and method that does not require additional process chambers for implementation.

It is a further object of this invention to provide copper conductors with a low likelihood of voiding.

It is a further object of this invention to provide such a method that is repeatable and consistent from wafer to wafer in the manufacturing process.

Other objects and advantages of this invention will be apparent to those of ordinary skill in the art having reference to the following specification together with its drawings.

The present invention may be implemented by exposing the surface of a low-dielectric-constant dielectric to nitrogen, after the etching of trenches and vias. This exposure can be implemented by introducing nitrogen gas prior to liner layer deposition. This nitrogen treatment can be supplemented by a nitrogen plasma treatment of the surface of the low-k dielectric. Subsequent sputter deposition of tantalum nitride, followed by tantalum sputtering, results in a TaN/Ta bilayer liner that adheres extremely well to the low-k dielectric. Copper conductors are then formed into the trenches and vias, and polished by chemical mechanical polishing (CMP) to form the copper conductors in the damascene manner. Excellent adhesion is obtained.

DETAILED DESCRIPTION OF THE INVENTION

The preferred embodiments of the invention will now be described in detail in connection with the fabrication of an integrated circuit having copper conductors, formed in the damascene or dual damascene manner. This description is presented by way of example only, and is not intended to limit the true scope of this invention. Specifically, it is contemplated that those skilled in the art having reference to this specification will readily identify various alternative implementations of this invention. It is to be understood that those and other alternatives are within the true scope of this invention, as claimed.

Figure 1A:
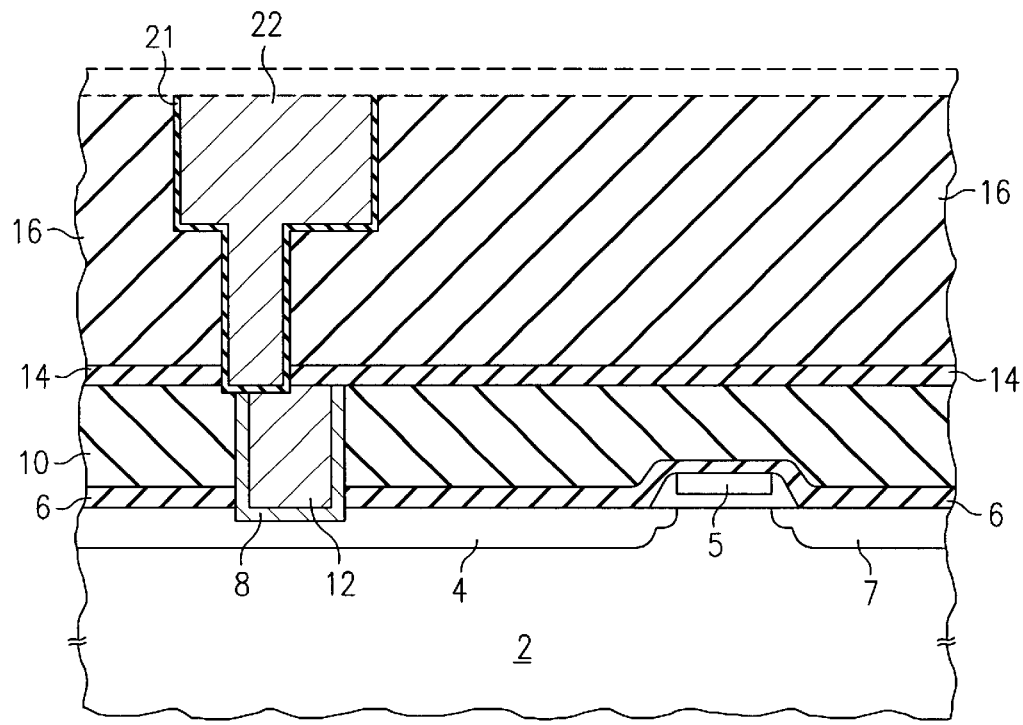
FIG. 1a is a cross-sectional view of an integrated circuit structure formed according to the preferred embodiments of the invention.
Figure 1B:
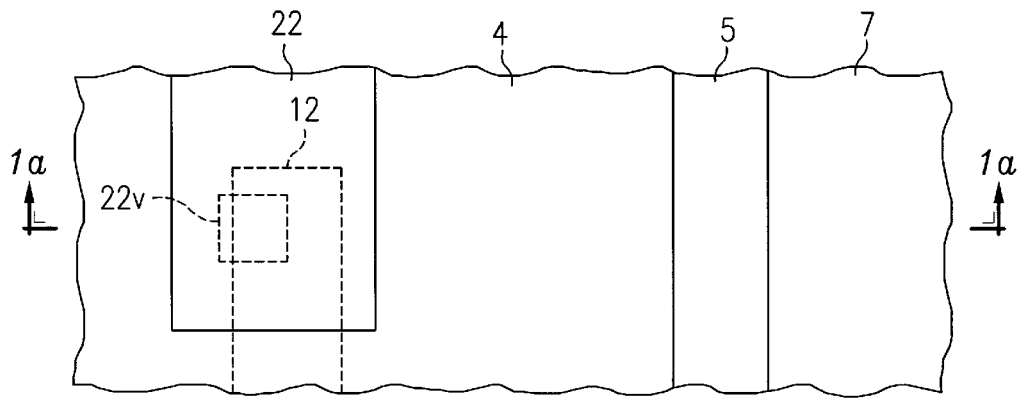
FIG. 1b is a plan view of the integrated circuit structure of FIG. 1a, according to the preferred embodiments of the invention.

FIGS. 1a and 1b illustrate, in cross-sectional and plan views, respectively, an integrated circuit structure constructed according to the preferred embodiment of the invention. In this example, an exemplary second-level metal conductor 22 physically and electrically contacts first level metal conductor 12, which in turn physically and electrically contacts source/drain region 4 of a metal-oxide-semiconductor (MOS) transistor. Source/drain region 4 is diffused into a surface of semiconductor (e.g., silicon) substrate 2. Substrate 2 may, of course, be a doped semiconductor body, or alternatively may be a doped well formed into a substrate, a silicon-on-insulator layer, or such other semiconductor body into which semiconductor devices can be formed. As such, second level metal conductor 22 is in contact with source/drain region 4, and thus makes contact to the active transistor that also includes source/drain region 7 and gate electrode 5, both of which are formed at a short distance from conductor 22 in this example. It will be understood by those skilled in the art having reference to this specification that the particular arrangement and placement of conductors 12, 22 relative to gate electrode 5 is presented by way of example only, and is not intended to establish any limitations on the location of these elements relative to one another. Other integrated circuit structures, such as field oxide or other isolation structures, not shown in FIGS. 1a and 1b for the sake of clarity, may also be implemented into the integrated circuit. It will also be understood by those skilled in the art having reference to this specification that conductors 12, 22 may be in contact with other integrated circuit elements besides diffused source/drain regions as shown in FIG. 1a, including other instances of gate electrodes 5, other conductor layers, well or substrate contacts, or the like.

According to this preferred embodiment of the invention, silicon nitride layer 6 is disposed at the surface of substrate 2, including at the surface of source/drain regions 4, 7 and gate electrode 5, as shown. A first low-dielectric constant (low-k) dielectric layer 10 overlies silicon nitride layer 6, and is substantially planarized as shown in FIG. 1a. According to the preferred embodiment of the invention, first low-k dielectric layer 10 is formed of fluorine-doped silicon dioxide (also referred to as fluorinated silicate glass, or FSG), deposited by chemical vapor deposition (CVD). If formed from such a low-k silicon oxide, low-k dielectric layer 10 may also be doped with boron, phosphorous, or both, when deployed at this location adjacent to the transistor. Other alternative materials for low-k dielectric layer 10 include organosilicate glass (OSG) as well as other low-k materials, examples of which include SiLK dielectric material available from Dow Chemical Co., the Zirkon LK series of spin-on dielectric materials available from Shipley Company L.L.C., and such other known low-k dielectric materials as HSQ, aerogel, xerogel, and the like.

First level copper conductor 12 is disposed within a via within low-k dielectric layer 10, overlying first conductive liner 8. Another layer of silicon nitride 14 is disposed at the surface of low-k dielectric layer 10, and a second low-k dielectric layer 16 is disposed over silicon nitride layer 14. Second low-k dielectric layer 16 is preferably formed of the same material as that of first low-k dielectric layer 10, to avoid undue process complexity. As such, second low-k dielectric layer 16 is formed of FSG, OSG, or another low-k dielectric material, as discussed above. As shown in FIG. 1a, second level copper conductor 22 is disposed within a two-level opening through second low-k dielectric layer 16. For purposes of this description, consistent with the usage in the art, the narrower lower portion of this opening is referred to as a via, while the larger, upper portion of this opening is referred to as a trench. Liner layer 21 is disposed under second level copper conductor 22. As evident from FIG. 1a, liner layer 21 is conductive, as it is disposed between first level copper conductor 12 and second level copper conductor 22; similarly, liner layer 8 is also conductive, as it is disposed between first level copper conductor 12 and source/drain region 4.

According to the preferred embodiment of the invention, liner layers 8, 21 are each formed of a bilayer construction, preferably of a layer of tantalum nitride (TaN) underlying a layer of tantalum (Ta). Also according to the preferred embodiment of the invention, and as will be described in further detail below, the surface portion of each of first and second low-k dielectric layers 10, 16 that are adjacent to liner layers 8, 21, respectively, is treated to be nitrogen-rich. This nitrogen-rich portion extends for a short distance into layers 10, 16 from their surface. It is believed, in connection with this invention, that this nitrogen-rich portion enhances the adhesion of liners 8, 21 to low-k dielectric layer 10, 16, by way of the reaction of tantalum metal with the nitrogen available in this portion of the film. It is contemplated that this nitrogen-rich surface portion of low-k dielectric layers 10, 16 can be detected in the structure by way of conventional analytical techniques, such as Auger spectroscopy or XPS analysis.

As evident from FIGS. 1a and 1b, two levels of copper metal conductors are shown, each of which implemented in combination with corresponding liners and with nitrogen-rich treatment of the underlying low-k dielectric layer. As known in the art, many modern integrated circuits now include more than two metal conductor levels, in some cases numbering up to eight metal conductor levels, some or all of which may be implemented in copper by way of a damascene process as described below. It is preferred that each of the dielectric layers separating the multiple metal levels be formed of a low-k dielectric, to improve electrical isolation between adjacent conductors in adjacent levels, as well as adjacent conductors in the same metal level. According to this invention, for each metal level that is implemented with copper, it is preferred that each low-k dielectric layer have a nitrogen-rich portion at its surface in contact with a corresponding liner layer including TaN upon which the copper metal conductors are formed. It is also contemplated that this invention may also be used in connection with any metallization system in which adhesion is an issue; this description of the preferred embodiments of the invention will be presented in connection with copper, however, as copper is a particularly beneficial metal material for the reasons noted above.

Referring now to FIGS. 2a through 2i and FIG. 3, a method of forming the metal interconnect layers of the integrated circuit structure of FIGS. 1a and 1b according to the preferred embodiments of the invention will now be described in detail. This description will be provided in connection with the forming of second level copper conductor 22 that is in contact with underlying first level copper conductor 12. As noted above, it will be understood that first level copper conductor 12, and of course any additional copper metal levels, are preferably formed in the same manner. Alternatively, first level conductor 12 may be formed of a different metal system, for example tungsten, polysilicon, or combinations thereof. It is contemplated that those skilled in the art having reference to this specification will be readily able to implement this invention in connection with these and other multiple level metal systems.

Figure 2A:
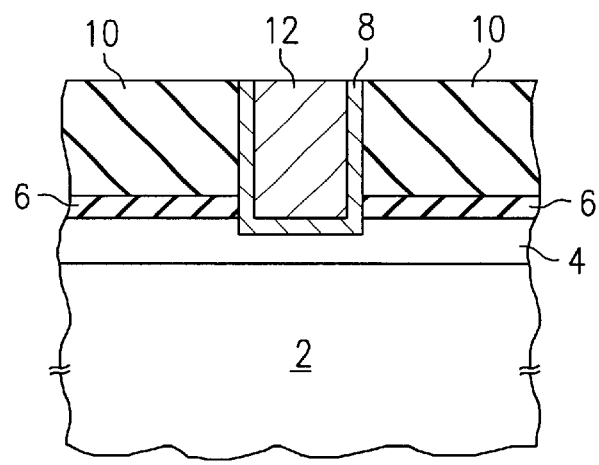
FIGS. 2a through 2i are cross-sectional views illustrating the formation of the structure of FIGS. 1a and 1b according to the preferred embodiments of the invention.

FIG. 2a illustrates a portion of a partially formed integrated circuit, in which source/drain region 4 has been formed at a surface of substrate 2. As noted above, substrate 2 may be a bulk silicon substrate, an epitaxial layer or a doped well at a surface of such a substrate, or a silicon-on-insulator layer into which active devices are formed. Typically, source/drain region 4 is formed by ion implantation and a diffusion anneal, and may have either the opposite or the same conductivity type as substrate 2, depending upon the device being formed. Also as noted above, while this description shows first level metal conductor 12 in contact with source/drain region 4, conductor 12 may instead be making contact to a polysilicon or metal electrode near the surface of substrate 2, perhaps serving as a gate electrode or a gate-level conductor, or may contact another device element such as a capacitor electrode or a resistor.

As shown in FIG. 2a, thin silicon nitride layer 6 overlies source/drain region 4. First level low-k dielectric layer 10 overlies silicon nitride layer 6, and is substantially thicker than silicon nitride layer 6, to provide the bulk of the isolation function between conductive levels. Liner layer 8 and first level copper conductor 12 are disposed through an opening etched through low-k dielectric layer 10. According to this preferred embodiment of the invention, and as noted above, the surface of low-k dielectric layer 10 is treated to be nitrogen-rich, for good adhesion to liner layer 8. The process for treating the surface of dielectric layer 10, and for depositing liner layer 8 and first level copper conductor 12 according to this preferred embodiment of the invention will be described in detail below in connection with the formation of second level metal conductor 22.

Figure 2B:
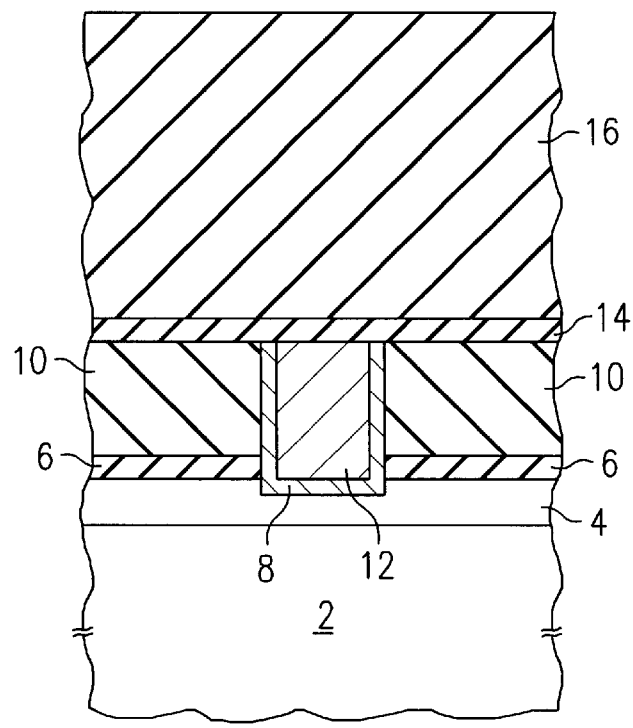

The formation of second level metal conductor 22 begins with the formation of the next level of insulating layers, as will now be described in connection with FIG. 2b. According to this preferred embodiment of the invention, silicon nitride layer 14 is formed by way of chemical vapor deposition (CVD), and is a relatively thin layer, for example on the order of 30 to 70 nm. Silicon nitride layer 14 will serve as an etch stop for the via and trench etch as will become apparent from this description. Low-k dielectric layer 16 is then formed overall, with the method of deposition dependent upon the particular material used for layer 16. According to the preferred embodiment of the invention, low-k dielectric layer 16 is fluorinated silicate glass (FSG), deposited by CVD of silicon dioxide in combination with fluorine source gas to provide the fluorine doping of layer 16. As noted above, other low-k dielectric materials may alternatively be used, including organosilicate glasses and other known materials. Some of these low-k dielectric materials are so-called spin-on glasses (SOG), in which case layer 16 is formed by spinning on the liquid material dispensed to the desired thickness. FIG. 2b illustrates the structure after the formation of low-k dielectric layer 16 over silicon nitride layer 14.

Figure 2C:
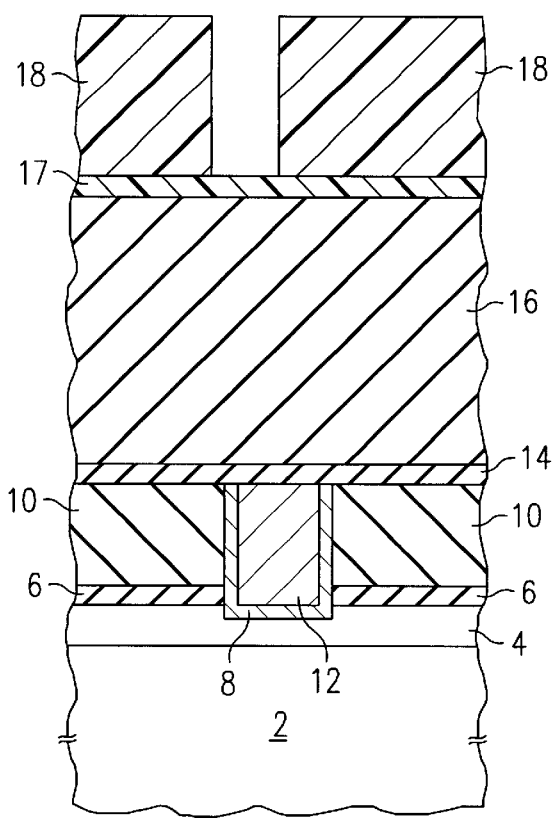

Referring now to FIG. 2c, the definition of a via through low-k dielectric layer 16 is next carried out. Bottom anti-reflective coating (BARC) 17 is first deposited over low-k dielectric layer 16. As known in the art, BARC 17 provides improved dimensional control for photolithography, by suppressing such optical effects as reflective notching, standing wave effects, and thin film interference. BARC 17 is formed of the appropriate material for the wavelength of the photolithography used to define this via, and is thus typically a conventional organic anti-reflective coating, many types and products of which are readily available, examples of which include the ARC coatings available from Brewer Science, Inc. Photoresist layer 18 is then spun on to the surface of BARC 17, and is photolithographically exposed and developed in the conventional manner to mask the portions of low-k dielectric layer 16 that are to be protected from the via etch, as shown in FIG. 2c.

Figure 2D:
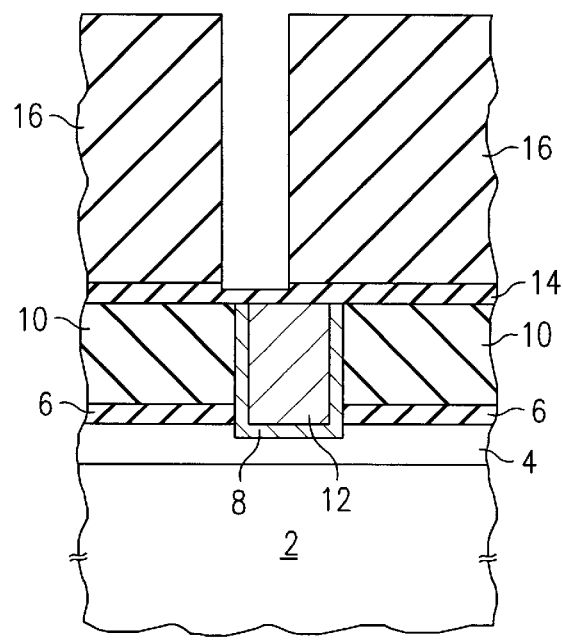

The structure is then subjected to the appropriate plasma or wet etch of low-k dielectric layer 16, to etch a narrow via through layer 16 and extending to silicon nitride layer 14, as shown in FIG. 2d. The particular etch chemistry and conditions will, of course, depend upon the material of low-k dielectric layer 16. BARC 17 is also preferably removed by this etch; alternatively, depending upon the materials used, BARC 17 may be cleared by a separate etch or cleanup step prior to via etch. The via etch preferably selectively etches low-k dielectric layer 16 relative to silicon nitride layer 14, so that the etch stops or slows dramatically upon reaching silicon nitride layer 14. The etch stop provided by layer 14 provides for a controllable via etch, and enables the use of the same via etch to form vias to conductive elements of different heights above the surface of substrate 2. This permits the second level metallization to make contact not only to first level copper conductors 12, but also directly to gate electrodes, diffused regions, and other elements of the integrated circuit. Photoresist 18 and underlying BARC 17 are then removed, to the extent remaining after via etch, resulting in the structure of FIG. 2d.

The width of the via formed by the preceding processes is contemplated to be extremely narrow, especially relative to the thickness of low-k dielectric layer 16. This steep aspect of the via is contemplated to be problematic for the deposition of copper. According to the preferred embodiment of the invention, therefore, the upper portion of this via is widened by a patterned etch of a trench, as will now be described relative to FIG. 2e.

Figure 2E:
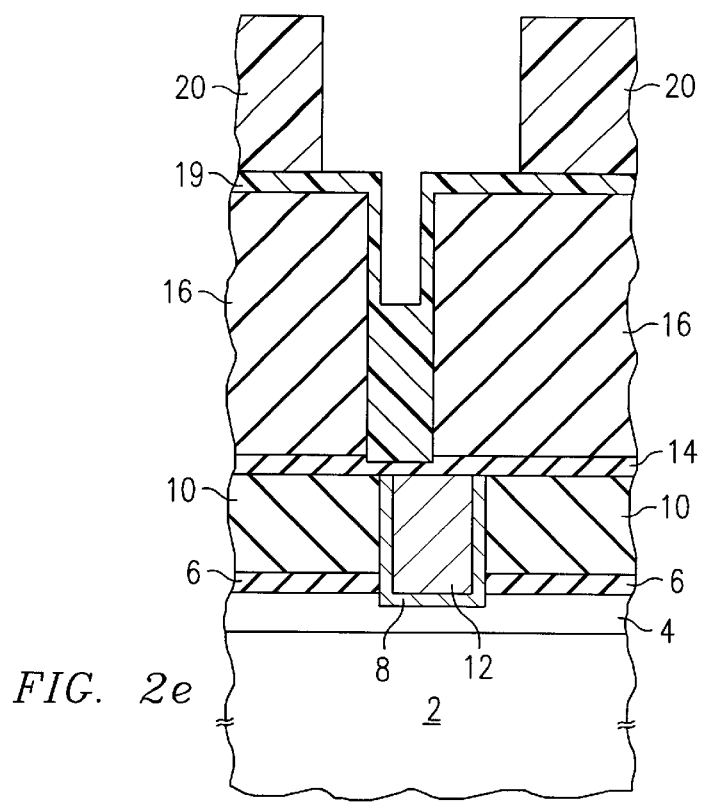
Figure 2F:
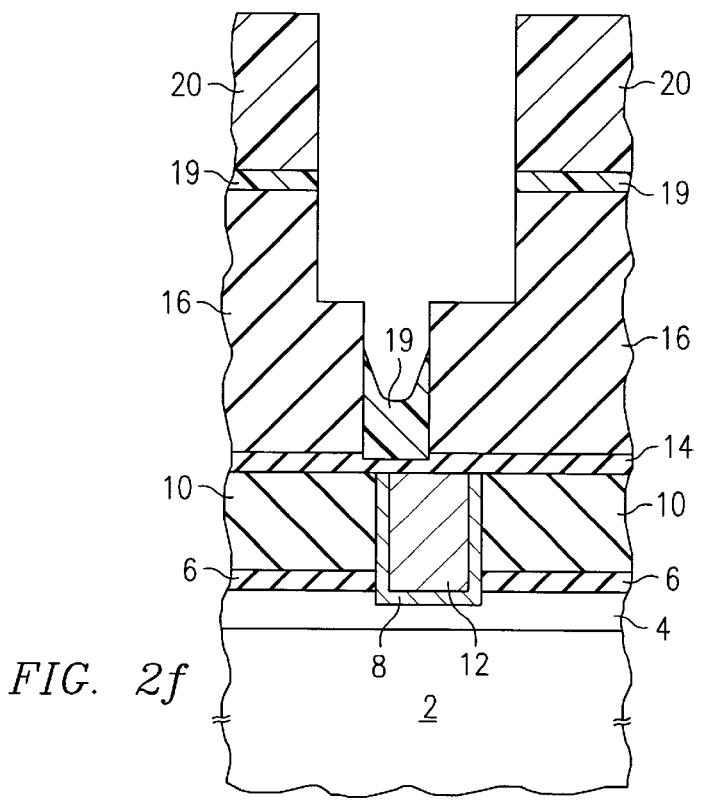

To accomplish the trench etch, BARC 19 is next deposited overall, including into the via through low-k dielectric layer 16, followed by the spinning on of photoresist 20. Conventional photolithographic exposure and development of photoresist 20 is then performed, resulting in the structure of FIG. 2e. As shown in this Figure, BARC 19 remains in place, including at the bottom of the etched via through low-k dielectric layer 16, while the remaining portions of photoresist 20 protect low-k dielectric layer 16 except at the trench locations. The pattern defined by photoresist 20, as shown in FIG. 2e, defines the location at which a wider trench is to be etched into low-k dielectric layer 16. FIG. 2f illustrates the result of the etch of BARC 19 and low-k dielectric layer 16, using the photoresist 20 feature illustrated in FIG. 2e. As evident from FIG. 2f, the portions of BARC 19 and low-k dielectric layer 16 that are not protected by photoresist 20 are etched by this trench etch. The additional thickness of BARC 19 that is deposited within the via, due to the topology of the structure, is etched along with the etch of low-k dielectric layer 16, but continues to protect silicon nitride layer 14 at the bottom of the via. This etch of low-k dielectric layer 16 is preferably a timed etch, considering that it is intended to only etch part of the way through the thickness of low-k dielectric layer 16, and therefore does not stop on an etch stop layer. The structure resulting from this timed etch is shown in FIG. 2f.

Remaining photoresist 20 is then stripped, in the conventional manner. A second etch is then performed to clear the bottom of the via. This second etch will remove the remaining portion of BARC 19 that was disposed under photoresist 20, and also that portion of BARC 19 that was in the bottom of the via. In addition, this second etch also clears the remaining silicon nitride layer 14 that is exposed at the bottom of the via once BARC 19 is removed. This second etch may be a timed etch, or may continue until detection of the endpoint of first level copper electrode 12. The structure at this point in the process, following the second clearing etch, is shown in FIG. 2g.

Figure 2H:
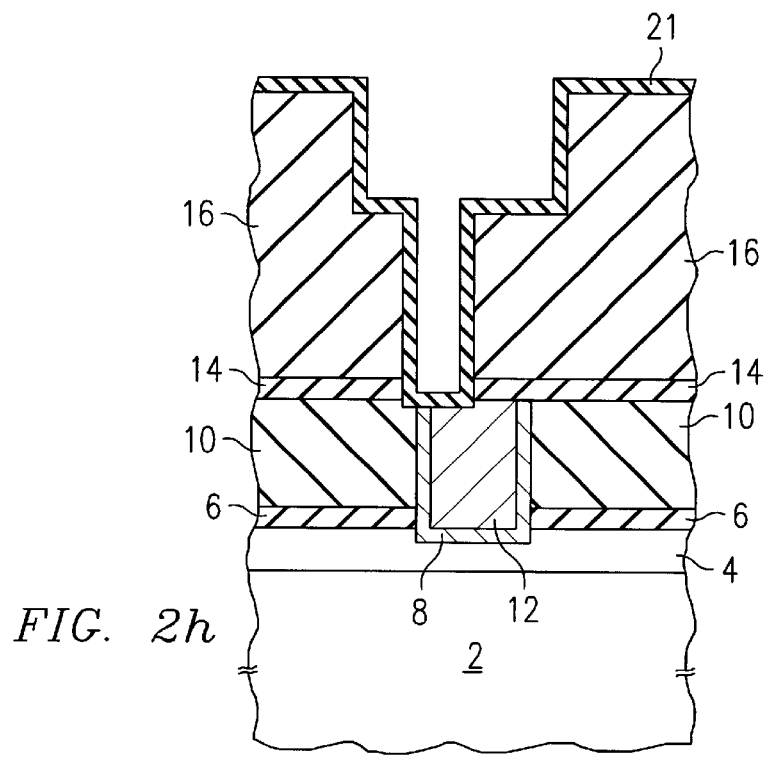
Figure 3:
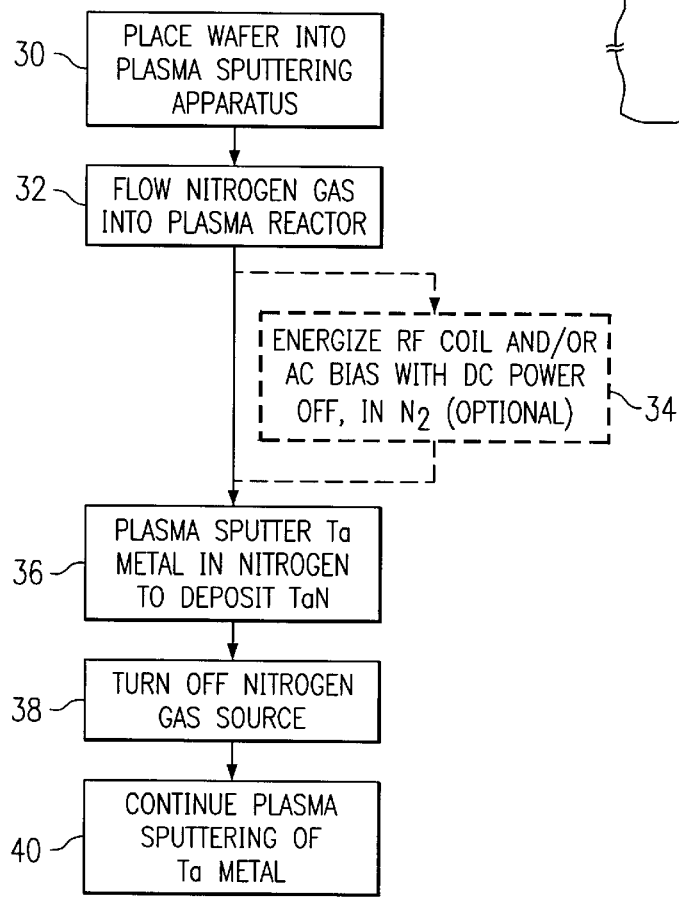
FIG. 3 is a flow chart illustrating the steps in a process of forming a copper metal conductor according to the preferred embodiments of the invention.

Referring now to FIG. 3 in combination with FIG. 2h, the process of treating the exposed portions low-k dielectric layers 16, and of forming liner layer 21, according to the preferred embodiment of the invention will now be described in detail.

Figure 2G:
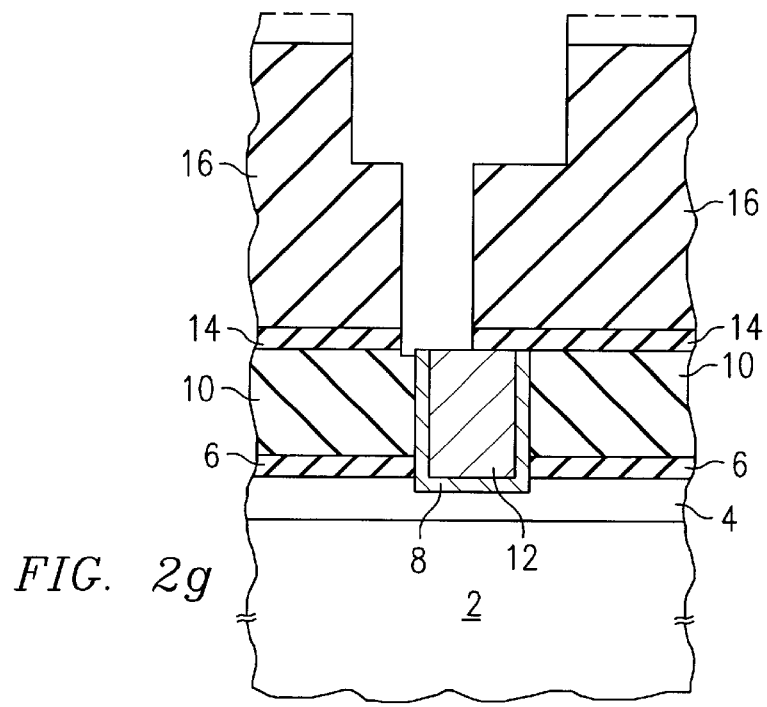

In process 30, the wafer containing the structure as illustrated in FIG. 2g is placed into the appropriate apparatus for depositing liner layer 21 by physical vapor deposition. According to the preferred embodiment of the invention, liner layer 21 is deposited by the physical vapor deposition mechanism of sputtering, in which a solid metal target is bombarded with high energy ions extracted from a plasma of one or more sputtering gases. Atoms of the metal are ejected from the target in response to the ion bombardment, and are deposited on a wafer placed in the sputtering chamber. According to this preferred embodiment of the invention, the metal target is tantalum metal, and the available sputtering gases are nitrogen and an inert gas, such as argon. As will be described below, the argon sputtering gas will be the primary sputtering gas, while the nitrogen gas is available for reaction with the liberated tantalum atoms to form a tantalum nitride film.

In process 32, the exposed surfaces of low-k dielectric layer 16, and also perhaps low-k dielectric layer 10 if exposed in the via (see FIG. 2h) are treated with nitrogen, to become nitrogen-rich at their surface. This treatment is accomplished, according to the preferred embodiment of the invention, by flowing nitrogen gas into the plasma reactor, prior to the application of the DC sputtering bias and prior to energizing the plasma. Process 32 is preferably performed at the temperatures and pressures that will be used in the sputtering of the liner layer 21, for example at room temperature and at a pressure of 40 mtorr. The nitrogen treatment, or pre-soak, of process 32 is preferably performed for a few seconds, for example from two to six seconds.

Process 34 may then be performed, if desired, following the pre-soak of process 32. In process 34, a plasma is energized in the sputtering apparatus, by energizing the RF coil in the conventional manner, while the nitrogen gas of process 32 continues to flow into the chamber. The DC sputtering is not yet energized in process 34, and no sputtering of the tantalum target is taking place at this time. Process 34 thus amounts to a nitrogen reactive plasma treatment of the exposed surfaces of the low-k dielectric layers 16 and 10. An additional option in process 34 is to also apply AC bias to the wafer, to modulate the plasma in the conventional manner and enhance the plasma nitrogen treatment of process 34. In either case, this plasma treatment of optional process 34 is preferably performed for a few seconds, for example two to four seconds.

It has been observed, from experiment, that significant improvement in adhesion of the bilayer liner and overlying copper metallization to underlying low-k dielectric material is obtained by the nitrogen treatment of process 32, as compared to a similar bilayer liner and copper metallization without the nitrogen treatment. This improvement is manifest both in a qualitative sense by the results of an adhesive tape lift-off test of the copper metallization, and also by quantitative measurement of the adhesion strength by way of a four-point bending test. In each case, to the extent that peeling of the metallization was observed, the peeling occurred at the interface between the liner layer and the underlying FSG or OSG low-k dielectric material. In addition, it has also been qualitatively observed that the inclusion of process 34 further improves the adhesion of the metal/liner system relative to the pretreatment by way of process 32 only. For example, less peeling in the adhesive tape test is observed for wafers undergoing two seconds of pretreatment process 32 and two seconds of plasma nitrogen treatment process 34, than for wafers undergoing four seconds of pretreatment process 32 alone. It is contemplated that the particular process times, and the inclusion or omission of process 34, will largely depend upon the particular manufacturing process limitations, as well as the inherent robustness of the liner and copper deposition processes in the specific manufacturing flow.

Following process 32, or process 34 if performed, process 36 is next carried out to reactively sputter tantalum nitride over the treated surface of low-k dielectric layers 16, 10, and into the via in contact with first level copper conductor 12. Process 36 is performed by energizing the plasma (if not already energized in process 34), and biasing the wafer and tantalum target, in the presence of the nitrogen and argon sputtering gases. Under these conditions, tantalum atoms are sputtered into the chamber, with at least a large portion of these atoms reacting with nitrogen to form tantalum nitride, which then deposits onto the surface of the wafer. It is also contemplated that some of the sputtered tantalum atoms react with the nitrogen in the nitrogen-rich surface portions of the low-k dielectric layers 16, 10, and that this reaction mechanism provides a resulting tantalum nitride layer in the liner layer 21 that is extremely well adhered to low-k dielectric layers 16, 10.

According to this preferred embodiment of the invention, the preferred materials of liner layer 21 are tantalum nitride underlying tantalum metal. It is contemplated that other metals and metal nitrides may also be useful as a liner layer. For example, titanium nitride is a well-known conductive material, and as such a bilayer liner of titanium nitride and titanium may be workable to underlie the eventual copper. However, it is also believed that the TaN/Ta bilayer is the preferred liner for copper metallization, according to modern technology.

Following the sputter deposition of tantalum nitride to the desired thickness in process 36, process 38 is then performed to turn off the nitrogen gas source into the sputtering chamber. In process 40, the sputtering of tantalum then continues, but in the absence of nitrogen, depositing a layer of tantalum metal over the previously deposited tantalum nitride. Process 40 continues until the desired thickness of tantalum is deposited, completing the formation of liner layer 21 as shown in FIG. 2h. Liner layer 21, formed according to this preferred embodiment of the invention, is thus a TaN/Ta bilayer, well-adhered to low-k dielectric layers 16, 10 because of the nitrogen surface treatment of processes 32, 34.

Figure 2I:
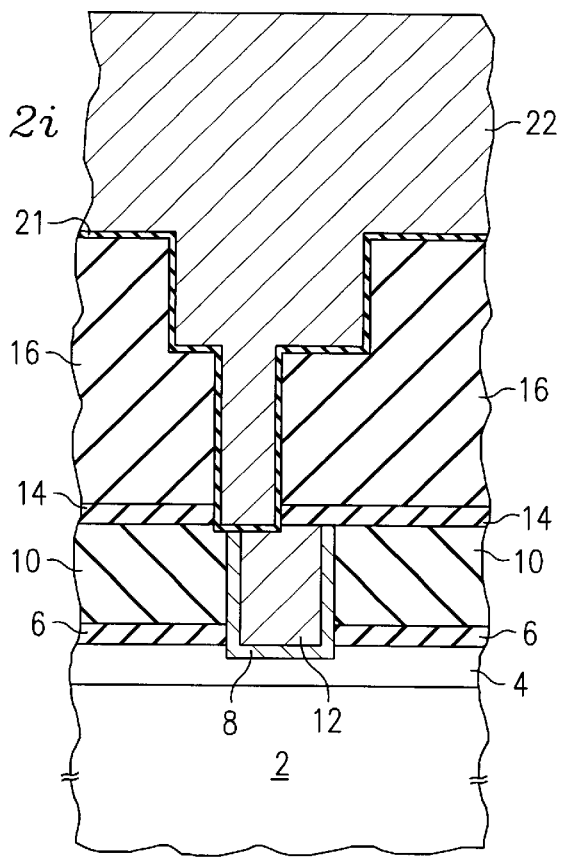

Referring now to FIGS. 2i and 1a, the completion of this second level of metallization according to the preferred embodiment of this invention will now be described. It is preferred that a relatively thin seed layer of copper be deposited over liner layer 21, for example by way of PVD or metal-organic CVD (MOCVD). This seed layer enables the higher volume and rate deposition of copper conductor 22, as shown in FIG. 2i, preferably by way of electrochemical deposition, namely electroplating. As shown in FIG. 2i, second level copper layer 22 is deposited to fill the via and trench, and to a substantial thickness above the surface of low-k dielectric layer 16. This thick plating ensures full coverage of all trenches and vias, and permits a reasonable process tolerance for the CMP used to planarize the structure.

The structure is completed, as shown in FIG. 1a described above, by CMP of the structure of FIG. 2i. This polishing removes all copper from the surface of low-k dielectric layer 16, so that second level copper conductors 22 reside only in the trench and via low-k dielectric layer 16, in an inlaid fashion. To ensure the absence of shorting filaments, the CMP process preferably continues to such an extent that a small portion of the surface of low-k dielectric layer 16 is also removed, as suggested in FIG. 1a by the dashed line at the surface of the structure. Second level copper conductor 22 is then in place within the integrated circuit structure.

Additional processing of the integrated circuit structure of FIG. 1a may now take place, such additional processing including the formation of additional levels of copper conductor, above those shown in FIG. 1a, as noted above. If such additional copper levels are implemented, it is preferred that a low-k dielectric material be used as the interlayer insulator, and that this dielectric be nitrogen treated prior to the deposition of the liner layer, in the manner described above according to the preferred embodiment of the invention.

The present invention provides many important advantages in the fabrication and structure of modern integrated circuits. As noted above, the nitrogen treatment of the low-k dielectric surface greatly enhances the adhesion of a sputtered liner, such as tantalum nitride, to that layer. It is believed that this enhanced adhesion is due to the presence of available nitrogen in the low-k dielectric layer, with which sputtered metal atoms (e.g., tantalum) can react and bond strongly to the low-k dielectric layer. This improved adhesion has been experimentally verified, both qualitatively and quantitatively. In addition, this improved adhesion is also manifest in tighter distributions of measured conductance of conductors both within the same wafer, and across multiple wafers. This improved adhesion is also indicated by improved via and metal line resistance stability of copper conductors after a high temperature bake that has been observed through experiment.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A method of fabricating an integrated circuit, comprising the steps of:

forming an insulating layer over a semiconductor body;

forming an opening in the insulating layer;

placing the semiconductor body in a plasma chamber;

after placing the semiconductor body in the plasma chamber and prior to applying a DC sputtering bias and prior to energizing a plasma, exposing a surface of the insulating layer and the opening to nitrogen to create a nitrogen-rich surface;

after creating the nitrogen-rich surface, forming a metal nitride over the nitrogen-rich surface by energizing a plasma in the plasma chamber and applying a DC sputtering bias in the presence of a nitrogen sputtering gas;

forming a metal layer over the metal nitride; and forming a conductor metal over the metal layer, the conductor metal extending into the opening.

2. The method of claim 1, wherein the conductor metal comprises copper.

3. The method of claim 1, wherein the metal layer comprises tantalum.

4. The method of claim 1, wherein the steps of exposing, forming a metal nitride and forming a metal layer are performed in the plasma chamber.

5. The method of claim 1, further comprising the step of plasma treating the insulating layer with nitrogen by energizing a plasma in the plasma chamber after the exposing step and prior to the step of forming the metal nitride.

6. The method of claim 1, wherein said insulating layer comprises fluorinated silicate glass.

7. The method of claim 1, wherein said insulating layer comprises organosilicate glass.

* * * * *